(12) United States Patent
Kurokawa

(10) Patent No.: US 10,014,565 B2
(45) Date of Patent: Jul. 3, 2018

(54) SIGNAL TRANSMISSION PATH COMPRISED OF FIRST AND SECOND PLURALITY OF SIGNAL LINES LAMINATED WITH AN INTERVAL REGULATION MEMBER

(71) Applicant: KYOCERA Document Solutions Inc., Osaka-shi, Osaka (JP)

(72) Inventor: Yuichiro Kurokawa, Osaka (JP)

(73) Assignee: KYOCERA Document Solutions Inc., Osaka-shi, Osaka (JP)

(*) Notice: Subject to any disclaimer, the term of this patent is extended or adjusted under 35 U.S.C. 154(b) by 0 days.

(21) Appl. No.: 15/331,677

(22) Filed: Oct. 21, 2016

(65) Prior Publication Data

US 2017/0117604 A1 Apr. 27, 2017

(30) Foreign Application Priority Data

Oct. 22, 2015 (JP) ................. 2015-208040

(51) Int. Cl.
*H01P 3/08* (2006.01)
*H05K 1/02* (2006.01)
*H01P 3/02* (2006.01)
*H05K 1/14* (2006.01)

(52) U.S. Cl.
CPC ................. *H01P 3/08* (2013.01); *H01P 3/02* (2013.01); *H01P 3/088* (2013.01); *H05K 1/0219* (2013.01); *H05K 1/0245* (2013.01); *H05K 1/0281* (2013.01); *H05K 1/147* (2013.01); *H05K 2201/0145* (2013.01); *H05K 2201/05* (2013.01); *H05K 2201/1028* (2013.01); *H05K 2201/10189* (2013.01); *H05K 2203/1572* (2013.01)

(58) Field of Classification Search
CPC .. H01P 3/08; H01P 3/081; H01P 3/082; H01P 3/088; H01P 3/04; H05K 1/0245
USPC .............................................. 333/1, 4, 5, 238
See application file for complete search history.

(56) References Cited

U.S. PATENT DOCUMENTS

| 4,382,236 A * | 5/1983 | Suzuki ................. H01B 7/0838 156/52 |
| 7,151,420 B2 * | 12/2006 | Brunker et al. ........ H01P 3/023 333/238 |
| 8,044,746 B2 * | 10/2011 | Blair et al. .............. H01P 3/006 333/247 |
| 2005/0139864 A1 * | 6/2005 | Chang et al. ..... H01L 23/49822 257/200 |
| 2006/0288570 A1 * | 12/2006 | Cannon et al. ......... H01P 3/088 29/830 |

(Continued)

FOREIGN PATENT DOCUMENTS

| JP | 2010143211 A | 7/2010 |
| JP | 2015139946 A | 8/2015 |

*Primary Examiner* — Benny Lee
(74) *Attorney, Agent, or Firm* — Alleman Hall Creasman & Tuttle LLP

(57) ABSTRACT

A signal transmission path includes a first cable, a second cable, and an interval regulation member. The first cable includes a plurality of signal lines arranged in parallel along one direction. The second cable includes a plurality of signal lines arranged in parallel along the one direction, and is laminated with the first cable. The interval regulation member forms a predetermined specific interval between the first cable and the second cable in a lamination direction in which the first cable and the second cable are laminated.

6 Claims, 3 Drawing Sheets

(56) References Cited

U.S. PATENT DOCUMENTS

2015/0213923 A1 7/2015 Yoshino

* cited by examiner

SIGNAL TRANSMISSION PATH COMPRISED OF FIRST AND SECOND PLURALITY OF SIGNAL LINES LAMINATED WITH AN INTERVAL REGULATION MEMBER

INCORPORATION BY REFERENCE

This application is based upon and claims the benefit of priority from the corresponding Japanese Patent Application No. 2015-208040 filed on Oct. 22, 2015, the entire contents of which are incorporated herein by reference.

BACKGROUND

The present disclosure relates to signal transmission paths and signal processing devices. More particularly, the present disclosure relates to signal transmission paths and signal processing devices suitable for differential signals.

Generally, flexible flat cables (hereinafter referred to as "FFC") are sometimes used as signal transmission paths in various electronic devices including copying machines and multifunction peripherals. An FFC is a flexible band-like signal transmission path which is formed of a plurality of conductors (signal lines) arranged in parallel, and film-like insulators sandwiching the conductors from both sides. By using the FFC, the plurality of signal lines can be collectively attached to and detached from a substrate, thereby facilitating the assembling work. In addition, since a space required for wiring is reduced, miniaturization of an electronic device can be achieved.

SUMMARY OF THE INVENTION

A signal transmission path according to one aspect of the present disclosure includes a first cable, a second cable, and an interval regulation member. The first cable includes a plurality of signal lines arranged in parallel along one direction. The second cable includes a plurality of signal lines arranged in parallel along the one direction, and is laminated with the first cable. The interval regulation member forms a predetermined specific interval between the first cable and the second cable in a lamination direction in which the first cable and the second cable are laminated.

A signal processing device according to one aspect of the present disclosure includes a double-sided substrate, a first connector, and a second connector. A signal processing portion configured to transmit or receive differential signals through the aforementioned signal transmission path is mounted on the double-sided substrate. The first connector is provided on a first main surface of the double-sided substrate. The first cable which includes one of the pair of signal lines for transmitting the differential signals is connected to the first connector. The second connector is provided on a second main surface of the double-sided substrate at a position opposed to the first connector across the double-sided substrate. The second cable which includes the other one of the pair of signal lines is connected to the second connector.

This Summary is provided to introduce a selection of concepts in a simplified form that are further described below in the Detailed Description with reference where appropriate to the accompanying drawings. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

DETAILED DESCRIPTION OF THE INVENTION

Hereinafter, an embodiment of the present disclosure will be described with reference to the accompanying drawings in order to allow understanding of the present disclosure. It should be noted that the following embodiment is an example embodying the present disclosure and does not limit the technical scope of the present disclosure.

Figure 1:
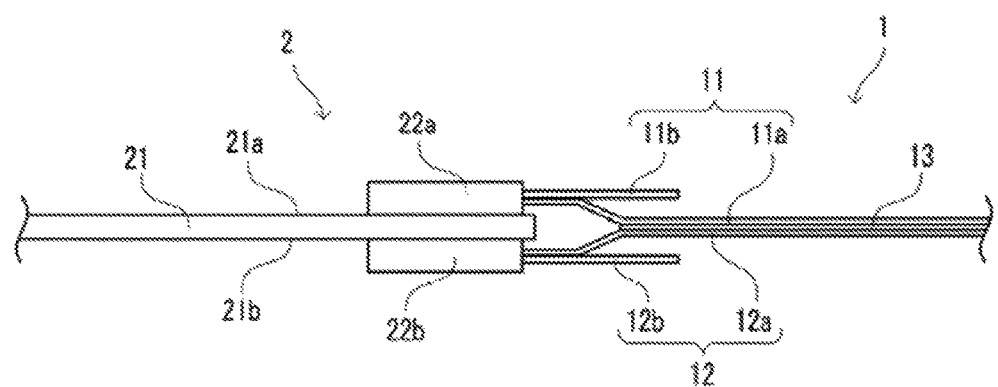
FIG. 1 is a diagram illustrating a signal transmission path and a signal processing device according to an embodiment of the present disclosure.

As shown in FIG. 1, a signal transmission path 1 and a signal processing device 2 according to an embodiment of the present disclosure are attachable to and detachable from each other. The signal transmission path 1 and the signal processing device 2 according to the present embodiment are mounted to, for example, an image reading apparatus, an image forming apparatus, and the like having a printer function, a scanner function, a copy function, a facsimile function, and the like. Of course, the signal transmission path 1 and the signal processing device 2 may be mounted to any electronic device besides the image reading apparatus and the image forming apparatus.

The signal transmission path 1 includes a first cable 11, a second cable 12 laminated on the first cable 11, and an interval regulation member 13 sandwiched therebetween. Specifically, the first cable 11 and the second cable 12 are flexible flat cables.

The first cable 11 includes a wiring portion 11a, and a reinforcing plate 11b fixed to each of both end portions of the wiring portion 11a. The wiring portion 11a includes a plurality of conductors arranged in parallel at regular intervals along one direction. Each conductor is formed of a flat (rectangular) copper foil plated with tin. The wiring portion 11a is an elastically deformable ribbon-like wiring which is configured by sandwiching these conductors with two thin insulating films to fix the conductors. The reinforcing plate 11b is a thick polyethylene terephthalate (PET) film for reinforcing each end portion of the wiring portion 11a, and allows the end portion of the wiring portion 11a to be easily attached to and detached from a first connector 22a.

Similar to the first cable 11, the second cable 12 includes a wiring portion 12a, and a reinforcing plate 12b fixed to each of both end portions of the wiring portion 12a. The second cable 12 may be a cable of the same specification as the first cable 11.

The interval regulation member 13 has a function of forming a predetermined specific interval between the first cable 11 (e.g., wiring portion 11a thereof) and the second cable 12 (e.g., wiring portion 12a thereof) in a lamination direction in which the first cable 11 and the second cable 12 are laminated. The interval regulation member 13 is, for example, a member provided between the first cable 11 and the second cable 12 in the lamination direction, and having a thickness equal to the aforementioned specific interval. The interval regulation member 13 is, for example, an insulating member made of resin.

Figure 2:
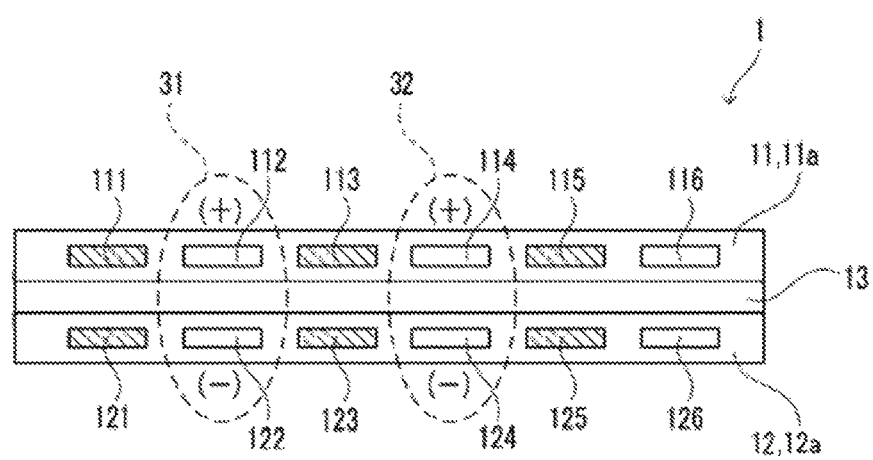
FIG. 2 is a cross-sectional view of the signal transmission path according to the embodiment of the present disclosure.

As shown in FIG. 2, the first cable 11 (e.g., wiring portion 11a thereof) and the second cable 12 (e.g., wiring portion 12a thereof) are fixed to the interval regulation member 13 such that signal lines 111, 112, 113, 114, 115, and 116 of the first cable 11 are opposed to signal lines 121, 122, 123, 124, 125 and 126 of the second cable 12, respectively, in the lamination direction.

Returning to FIG. 1, the signal processing device 2 includes a double-sided substrate 21, the first connector 22a, and a second connector 22b. A signal processing portion (not shown) for transmitting or receiving differential signals through the signal transmission path 1 is mounted on the double-sided substrate 21. The differential signals are signals used for a differential transmission system capable of performing high-speed signal transmission, and are signals of opposite phases to be transmitted through a pair of signal lines.

The first connector 22a is disposed on a first main surface 21a of the double-sided substrate 21 at a position near an end portion of the double-sided substrate 21. The second connector 22b is disposed on a second main surface 21b of the double-sided substrate 21 at a position opposed to the first connector 22a across the double-sided substrate 21. The first cable 11 is connected to the first connector 22a, and the second cable 12 is connected to the second connector 22b.

On the double-sided substrate 21, one of the pair of signal lines for transmitting the differential signals is connected to the first connector 22a while the other signal line is connected to the second connector 22b. Therefore, the differential signals transmitted or received by the signal processing portion are distributed to the first cable 11 connected to the first connector 22a and the second cable 12 connected to the second connector 22b, respectively, when being transmitted.

For example, in FIG. 2, a first differential signal is transmitted through a signal line pair 31 composed of a positive (+) signal line 112 included in the first cable 11 and a negative (−) signal line 122 included in the second cable 12, which signal lines are opposed to each other in the lamination direction. Meanwhile, a second differential signal is transmitted through a signal line pair 32 composed of a positive (+) signal line 114 included in the first cable 11 and a negative (−) signal line 124 included in the second cable 12, which signal lines are opposed to each other in the lamination direction.

As a countermeasure against electro-magnetic interference (EMI), signal lines 111, 113, 121, and 123 adjacent to the signal line pair 31 through which the first differential signal is transmitted are desirably used as ground lines in order to suppress crosstalk. For the same reason, signal lines 113, 115, 123, and 125 adjacent to the signal line pair 32 through which the second differential signal is transmitted are also desirably used as ground lines.

The signal transmission path 1 is also able to transmit a normal signal together with the differential signals. For example, in FIG. 2, a signal line 116 of the first cable 11 and a signal line 126 of the second cable 12 may be used for transmission of a normal signal.

Figure 3:
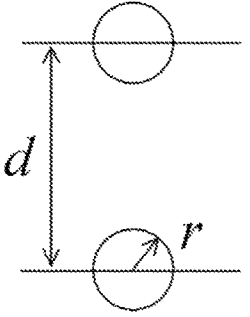
FIG. 3 is a diagram illustrating a reason why impedance can be controlled by the signal transmission path according to the embodiment of the present disclosure.

As a countermeasure against EMI, it is also effective to control an impedance between the pair of signal lines through which the differential signals are transmitted. An impedance Zo between two parallel wiring lines is obtained according to formulae shown in FIG. 3. In FIG. 3, L represents an inductance, C represents a capacitance, R represents a resistance, Zo represents an impedance, μ represents a magnetic permeability, π represents the circular constant, d represents the distance between the wiring lines, r represents a radius of each wiring line, ε represents a dielectric constant, and f represents a frequency. The impedance Zo is a function of the inductance L and the capacitance C, and the inductance L and the capacitance C are functions of the distance d. Therefore, the impedance Zo is a function of the distance d. Accordingly, the impedance Zo between the two parallel wiring lines varies depending on the distance d between the wiring lines. The units in which each L, C, R, and Zo are expressed are provided in brackets following the respective equations. H represents Henrys, m represents meters, F represents Farads, and Ω represents Ohms.

In the present embodiment, the impedance between the signal lines 112 and 122 of the signal line pair 31 and the impedance between the signal lines 114 and 124 of the signal line pair 32 can be controlled by varying the thickness of the interval regulation member 13. That is, the thickness of the interval regulation member 13 (i.e., the interval between the first cable 11 and the second cable 12 which is formed by the interval regulation member 13) in the present embodiment is determined so that the impedance between the signal line pair composed of the first signal line included in the first cable 11 and the second signal line included in the second cable 12, which signal lines are opposed to each other in the lamination direction, has a predetermined value.

Generally, when a plurality of differential signals are transmitted by using an FFC, a signal line pair for transmitting the differential signals is sandwiched with ground lines. However, in the case where the signal line pair for transmitting the differential signals is sandwiched with the ground lines, the number of the signal lines is increased by the number of the ground lines, and therefore an FFC having more signal lines needs to be used. In contrast to the above case, according to the present embodiment, the signal line pair for transmitting the differential signals is distributed to the first cable 11 and the second cable 12. Therefore, the width of the signal transmission path 1 can be reduced as compared to the case of transmitting the differential signals by using a single cable, leading to reduction in the size of the connectors and the size of the substrate on which the connectors are disposed. Consequently, miniaturization of an electronic device such as a multifunction peripheral can be achieved.

As FFCs subjected to countermeasures against EMI, an impedance-controlled FFC, a shielded FFC, and the like have been generally provided. However, these special FFCs are more expensive than ordinary FFCs. In contrast to this, according to the present embodiment, two existing cables which are inexpensively available are laminated to form the signal transmission path 1. Therefore, the signal transmission path 1 can be inexpensively realized. Further, existing connectors can be used as the first connector 22a and the second connector 22b.

Generally, the pitch of signal lines in an FFC and the width (terminal width) of each signal line are defined by connectors to be connected to the signal lines, and therefore it is difficult to adjust the impedance between the signal lines to a predetermined value. In contrast to this, according to the present embodiment, the impedance can be controlled by varying the thickness of the interval regulation member 13. Therefore, an impedance-controlled signal transmission path 1 suitable for transmission of the differential signals can be inexpensively realized without using expensive impedance-controlled cables.

Figure 4:
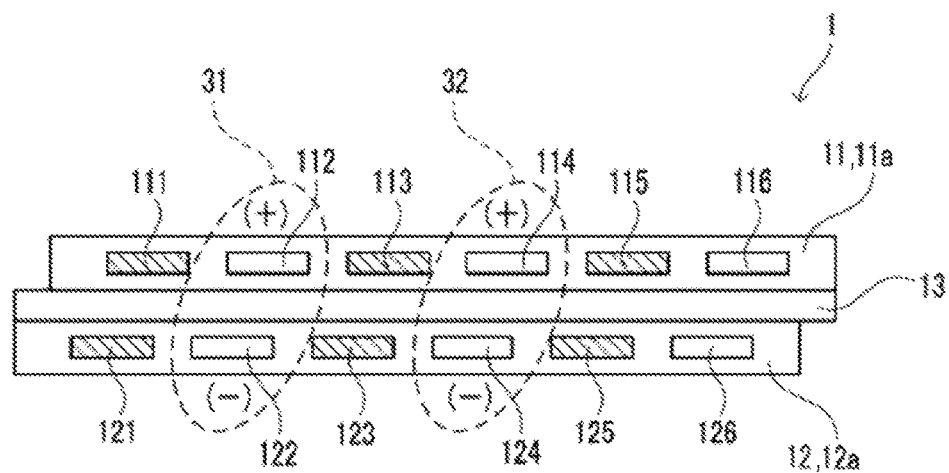
FIG. 4 is a cross-section view of a signal transmission path according to a modification of the present disclosure.

FIG. 4 shows a signal transmission path 1 according to a modification. The labeled components of FIG. 4 correspond to the components of FIG. 2 with the same numbers. As shown in FIG. 4, the first cable 11 and the second cable 12 may be laminated to be shifted from each other in a width direction (i.e., a direction orthogonal to the lamination direction) such that the pair of signal lines opposed to each other in the lamination direction are shifted in the direction orthogonal to the lamination direction. Thus, the impedance between the pair of signal lines through which the differential signals are transmitted can be finely controlled by changing the amount of shift in the width direction, without changing the thickness of the interval regulation member 13.

It is to be understood that the embodiments herein are illustrative and not restrictive, since the scope of the disclosure is defined by the appended claims rather than by the description preceding them, and all changes that fall within metes and bounds of the claims, or equivalence of such metes and bounds thereof are therefore intended to be embraced by the claims.

The invention claimed is:

1. A signal transmission path comprising:
   a first cable including a plurality of signal lines arranged in parallel along one direction;
   a second cable including a plurality of signal lines arranged in parallel along the one direction, the second cable being laminated with the first cable; and
   an interval regulation member configured to form a predetermined specific interval between the first cable and the second cable in a lamination direction in which the first cable and the second cable are laminated, wherein
   each of wiring portions of the first cable and the second cable is configured such that a plurality of conductors are sandwiched by two insulating films,
   at opposite end portions of each of the wiring portions of the first cable and the second cable, reinforcing plates formed from a PET film are respectively provided,
   the reinforcing plates of the first cable are provided on a surface of the wiring portion of the first cable that is opposite to the second cable, and
   the reinforcing plates of the second cable are provided on a surface of the wiring portion of the second cable that is opposite to the first cable.

2. The signal transmission path according to claim 1, wherein the interval regulation member is a member which is provided between the first cable and the second cable in the lamination direction, and has a thickness equal to the specific interval.

3. The signal transmission path according to claim 2, wherein
   the first cable and the second cable are fixed to the interval regulation member such that respective ones of the signal lines of the first cable are opposed to corresponding ones of the signal lines of the second cable in the lamination direction, and
   the thickness of the interval regulation member is a thickness which allows an impedance between a pair of signal lines to have a predetermined value, the pair of signal lines being composed of a first signal line of the plurality of signal lines included in the first cable and a second signal line of the plurality of signal lines included in the second cable, the first and second signal lines being opposed to each other in the lamination direction.

4. The signal transmission path according to claim 3, wherein the pair of signal lines are shifted from each other in a direction orthogonal to the lamination direction.

5. The signal transmission path according to claim 1, wherein the interval regulation member is an insulating member.

6. A signal processing device comprising:
   a double-sided substrate on which a signal processing portion is mounted, the signal processing portion being configured to transmit or receive differential signals through the signal transmission path according to claim 1;
   a first connector which is provided on a first main surface of the double-sided substrate, and to which the first cable is connected, the first cable including one of the pair of signal lines for transmitting the differential signals; and
   a second connector which is provided on a second main surface of the double-sided substrate at a position opposed to the first connector across the double-sided substrate, and to which the second cable is connected, the second cable including the other one of the pair of signal lines.

* * * * *